United States Patent
Yamaguchi et al.

(10) Patent No.: US 9,548,253 B2
(45) Date of Patent: Jan. 17, 2017

(54) SEMICONDUCTOR DEVICE AND METHOD OF MANUFACTURING THE SAME

(71) Applicant: FUJI ELECTRIC CO., LTD., Kawasaki (JP)

(72) Inventors: Kei Yamaguchi, Matsumoto (JP); Yuji Ichimura, Matsumoto (JP); Daisuke Kimijima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/457,701

(22) Filed: Aug. 12, 2014

(65) Prior Publication Data

US 2015/0069601 A1    Mar. 12, 2015

(30) Foreign Application Priority Data

Sep. 6, 2013 (JP) ................................. 2013-185063
Jul. 9, 2014 (JP) ................................. 2014-141603

(51) Int. Cl.
 *H01L 21/56*   (2006.01)
 *H01L 23/29*   (2006.01)
 *H01L 23/31*   (2006.01)

(52) U.S. Cl.
 CPC ............ *H01L 23/293* (2013.01); *H01L 21/56* (2013.01); *H01L 21/566* (2013.01); *H01L 23/3121* (2013.01); *H01L 2224/48091* (2013.01); *H01L 2224/48227* (2013.01); *H01L 2224/73265* (2013.01); *H01L 2924/13055* (2013.01)

(58) Field of Classification Search
 None
 See application file for complete search history.

(56) References Cited

U.S. PATENT DOCUMENTS 5,430,330 A    7/1995 Takahama et al.
6,864,574 B1 *  3/2005 Nobori ............... H01L 23/3107
                                                   257/706

(Continued)

FOREIGN PATENT DOCUMENTS

JP      6-5742      1/1994
JP     11-204724    7/1999

(Continued)

OTHER PUBLICATIONS

Tadanori Yamada et al., "Compact Type IPM for Inverter Air Conditioners", *Fuji Electric Journal*, Nov. 2012, pp. 430 (42)-434 (46), vol. 85, No. 6.

*Primary Examiner* — Erik Kielin (57) ABSTRACT

A method of manufacturing a semiconductor device and a semiconductor device that is manufactured by the method. In the method of manufacturing a semiconductor device, a releasing sheet is disposed in close contact with a hole of an aluminum plate having the recessed hole, and a skeleton structure of a semiconductor device is put into the recessed hole. Then, liquid epoxy resin is poured into the recessed hole. After hardening, the epoxy resin body 10 including the skeleton structure is taken out from the recessed hole to complete manufacturing the semiconductor device. Using a simple molding jig including the aluminum plate, and covering the skeleton structure with the epoxy resin body, a highly reliable semiconductor device with a case-less construction can be manufactured.

18 Claims, 6 Drawing Sheets

(56) References Cited

U.S. PATENT DOCUMENTS

| | | | |
|---|---|---|---|
| 2002/0110956 A1* | 8/2002 | Kumamoto et al. | 438/108 |
| 2004/0089928 A1* | 5/2004 | Nakajima | H01L 21/565 |
| | | | 257/678 |
| 2005/0048693 A1* | 3/2005 | Yoon | 438/106 |
| 2006/0272150 A1 | 12/2006 | Eguchi et al. | |
| 2007/0278667 A1* | 12/2007 | Kusano et al. | 257/712 |
| 2008/0284007 A1* | 11/2008 | Horio | H01L 25/072 |
| | | | 257/734 |
| 2009/0166923 A1* | 7/2009 | Murugan et al. | 264/272.17 |
| 2009/0215230 A1* | 8/2009 | Muto et al. | 438/124 |
| 2009/0283900 A1* | 11/2009 | Yamada | 257/698 |
| 2010/0295187 A1* | 11/2010 | Tsuruoka | H01L 23/24 |
| | | | 257/773 |
| 2012/0127668 A1* | 5/2012 | Yamamoto et al. | 361/715 |
| 2013/0270684 A1* | 10/2013 | Negishi | H01L 21/565 |
| | | | 257/675 |

FOREIGN PATENT DOCUMENTS

| | | | |
|---|---|---|---|
| JP | 2010-199152 A | * | 9/2010 |
| JP | 2011-238803 | | 11/2011 |
| WO | WO 2005/040563 A1 | | 1/2005 |

\* cited by examiner

SEMICONDUCTOR DEVICE AND METHOD OF MANUFACTURING THE SAME

CROSS-REFERENCE TO RELATED APPLICATIONS

This application is based on, and claims foreign priority benefit of Japanese Patent Application No. 2013-185063, filed on Sep. 6, 2013, and of Japanese Application No. 2014-141603, filed on Jul. 9, 2014, the disclosures of each of which are incorporated herein by reference.

BACKGROUND

1. Field

Embodiments of the present invention relate to a semiconductor device and a method of manufacturing the semiconductor device that is a semiconductor module having a case-less construction, for example.

2. Description of Related Art

Figure 10:
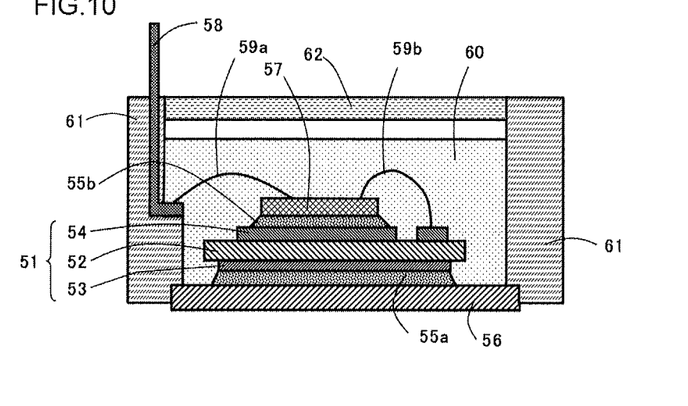
FIG. 10 is a sectional view of a schematic construction of a part of a conventional semiconductor module 500 having a terminal case 61.

FIG. 10 is a schematic sectional view of a part of a conventional semiconductor module 500 having a terminal case 61. This semiconductor module can be referred to as a semiconductor device having a case construction.

The semiconductor module 500, which is a general insulated gate bipolar transistor (IGBT) power module, includes semiconductor chips 57 such as an IGBT chip and a diode chip mounted on an insulated circuit board 51 with a conducting pattern.

The insulated circuit board 51 with a conducting pattern includes a ceramics 52 and metal foils adhered onto the upper and lower surfaces of the ceramics 52. The lower metal foil 53, which is a conductive layer, is joined to a metal base plate 56 with a solder 55a. The metal foil 54, which is a conducting pattern layer, on the upper surface of the ceramics 52 is adhered to the semiconductor chip 57 with a solder 55b. A terminal case 61 is adhered to the peripheral region of the metal base plate 56 with an adhesive.

The terminal case 61 has an externally leading out terminal 58, which is an externally leading out metal terminal, insert-molded. The externally leading out terminal 58 is connected to the semiconductor chip 57 through a bonding wire 59a. Then, the terminal case 61 is filled with silicone gel 60 and closed with a lid 62 at the top of the terminal case to complete the semiconductor module 500. The lid 62 is made of the same resin as that of the terminal case 61. The terminal case 61 is an outer frame made of a resin and holding the inserted externally leading out terminal 58.

Patent Document 2 discloses a semiconductor module having silicone gel filling a terminal case and epoxy resin thereon covering the terminal case. Patent Document 4 and Non-patent Document 1 disclose a semiconductor module having epoxy resin filling a terminal case but without a lid covering the terminal case.

The terminal case 61 is most often formed of a thermoplastic resin such as polyphenylene sulfide (PPS). For insulation protection against creeping discharge along the ceramic insulated circuit board 51 and for insulation protection of the semiconductor chip 57, the terminal case 61 is generally filled with silicone gel 60 or epoxy resin.

In order to ensure high temperature continuous operation of onboard IGBT power modules that need high temperature continuous operation, power cycle life needs to be elongated.

For elongating the power cycle life, epoxy resin exhibiting a high elastic modulus is more advantageous than silicone gel exhibiting a low elastic modulus. A high elastic modulus helps firmly hold solder joints and bonding wire joints and relaxes the stress on the joints caused by the difference in linear expansion of the components in the power cycle operation.

Examples of semiconductor modules with a case-less construction having no terminal case are disclosed in Patent Document 1 and Patent Document 2 that disclose semiconductor modules of a mold structure.

Patent Documents 1, 2, and 3 also disclose the use of transfer molding and compression molding for sealing a semiconductor module.

Patent Document 2 also discloses the use of a base plate and a frame jig for manufacturing a semiconductor module with a case-less construction in diversified, small-lot production.

[Patent Document 1]
Japanese Patent No. 3390661 (FIG. 1 in particular)
[Patent Document 2]
Japanese Unexamined Patent Application Publication No. 2011-238803 (FIG. 18 in particular)
[Patent Document 3]
Japanese domestic re-publication of PCT international application corresponding to international publication WO2005/004563
[Patent Document 4]
Japanese Unexamined Patent Application Publication No. H06-005742
[Non-Patent Document 1]
Fuji Electric Technical Journal 2012, vol. 85, no. 6, pages 430-434 (in Japanese)

In the semiconductor module with a terminal case structure disclosed in Non-patent Document 1 and Patent Document 4, sealing epoxy resin adheres to the terminal case with high strength when it hardens.

When the terminal case is formed of polyphenylene sulfide (PPS) resin, the PPS resin directly affects the sealing epoxy resin due to anisotropy of glass fibers in the PPS resin and the crystallization temperature, Tg=90° C.-130° C.

As a result, large internal stress is generated in the semiconductor module and hinders elongation of power cycle life of the semiconductor module, hardly achieving high reliability.

A means to solve this problem is sealing the semiconductor chip with epoxy resin by means of transfer molding or compression molding without using a terminal case. This method of manufacturing a semiconductor module having case-less construction, however, needs expensive molding equipment and a metallic mold, and thus requires high equipment investment costs. Because diversified, small-lot production of semiconductor modules needs various types of expensive metal molds, this manufacturing method is not suited to diversified, small-loot production.

The semiconductor modules with a case-less construction disclosed in Patent Document 1 and Patent Document 2 are manufactured by means of transfer molding, and the semiconductor module disclosed in Patent Document 3 is manufactured by means of compression molding. Both these molding techniques need very expensive molding equipment and metallic mold, at a cost of several tens to one hundred million yen, and are not suited to diversified, small-lot production.

The method proposed in Patent Document 2, though suited to diversified, small-lot production, needs a large number of parts and takes a lot of labor for assembling, dismantling, and cleaning of jigs, raising the manufacturing costs.

All of Patent Documents 1 through 4 and Non-patent Document 1 fail to disclose a method of manufacturing a semiconductor module with a case-less construction that use neither transfer molding nor compression molding.

SUMMARY

Embodiments of the present invention have been made in view of the problems described above. An aspect of the present invention is to provide a method of manufacturing a semiconductor device, the method being capable of manufacturing a semiconductor device of high reliability, caseless construction in diversified, small-lot production without using transfer molding and compression molding. Another object is to provide a semiconductor device that is manufactured by the method of manufacturing a semiconductor device.

In order to achieve the above object, a first aspect of the present invention is a method of manufacturing a semiconductor device comprising: disposing a releasing sheet into a recessed hole formed in a support plate; disposing a skeleton structure of the semiconductor device before covering with epoxy resin into the recessed hole; pouring liquid epoxy resin into the recessed hole; hardening the liquid epoxy resin to obtain an epoxy resin body containing the skeleton structure; and taking out the hardened epoxy resin body from the recessed hole having the releasing sheet attached on the hole.

Disposing the releasing sheet into the recessed hole enables the hardened epoxy resin body to be smoothly taken out from the recessed hole.

A second aspect of the invention is the method according to the first aspect of the invention, wherein the configuration of the recessed hole is a rectangular parallelepiped. In order to obtain a semiconductor device with the configuration of the hardened epoxy resin body in a rectangular parallelepiped, the configuration of the recessed hole is necessarily a rectangular parallelepiped.

A third aspect of the invention is the method according to the first aspect of the invention, wherein the configuration of the releasing sheet is such a configuration that fits to the recessed hole. And the releasing sheet is so thin that the configuration of the epoxy resin body is similar to the configuration of inside of the recessed hole.

A fourth aspect of the invention is the method according to the first aspect of the invention, wherein the releasing sheet is fitted in close contact to an inner wall of the recessed hole.

The releasing sheet fitted in close contact to an inner wall of the recessed hole enables the configuration of the releasing sheet coincident with the configuration of the recessed hole.

A fifth aspect of the invention is the method according to the first aspect of the invention, wherein the releasing sheet is fitted in close contact to an inner wall of the recessed hole by means of evacuation.

The releasing sheet fitted in close contact to an inner wall of the recessed hole by means of evacuation enables the releasing sheet adhered more firmly to the recessed hole as compared with the method of the fourth aspect of the invention.

A sixth aspect of the invention is the method according to the first aspect of the invention, wherein the viscosity of the liquid epoxy resin is at most 50 Pa-s at a time of pouring.

The viscosity of the liquid epoxy resin at most 50 Pa-s at a time of pouring enables the liquid epoxy resin to permeate throughout the complicated configuration of the skeleton structure and restrain void generation.

A seventh aspect of the invention is the method according to the first aspect of the invention, wherein the releasing sheet is made of a fluorine-containing resin.

The releasing sheet made of a fluorine-containing resin enables the epoxy resin body containing the skeleton structure to be taken out smoothly.

An eighth aspect of the invention is the method according to the seventh aspect of the invention, wherein the fluorine-containing resin is selected from the group consisting of polytetrafluoroethylene, polytetrafluoroethylene/perfluoro-alcoxyethylene copolymer, and tetrafluoroethylene/ethylene copolymer.

These types of fluorine-containing resin are preferable for use in the releasing sheet.

A ninth aspect of the invention is the method according to the first aspect of the invention, wherein adhesion strength between the releasing sheet and the hardened epoxy resin body is at most 10 kPa.

The adhesion strength at most 10 kPa enables the hardened epoxy resin body to be smoothly released from the releasing sheet.

A tenth aspect of the invention is the method according to the first aspect of the invention, wherein the releasing sheet and a metallic base plate of the skeleton structure of the semiconductor device are pressed against each other with a pressure at least 2 kPa.

Pressing the two members against each other with a pressure of at least 2 kPa prevents epoxy resin from adhering to the back surface of the metallic base plate.

An eleventh aspect of the invention is the method according to the first aspect of the invention, wherein the skeleton structure of the semiconductor device is turned upside down and disposed in the recessed hole with an arrangement not to be in contact with an inner wall of the recessed hole, and a back surface of a metallic base plate composing the skeleton structure of the semiconductor device is exposing from the surface of the poured liquid epoxy resin.

This method prevents the epoxy resin from adhering to the back surface of the metallic base plate.

A twelfth aspect of the invention is a semiconductor device having a case-less construction manufactured by the method according to any one of the first through tenth aspects of the invention, comprising: an insulated circuit board with a conducting pattern, the circuit board having a conductive layer on a back surface of an insulating substrate of the circuit board and a conducting pattern layer on a front surface of the circuit board; a metallic base plate that is adhered through a solder to the conductive layer of the insulated circuit board; a semiconductor chip adhered to the conducting pattern layer; an externally leading out terminal that is adhered to the conducting pattern layer; a bonding wire connecting the semiconductor chip and the conducting pattern layer; and an epoxy resin body from which a back surface of the metallic base plate and an end portion of the externally leading out terminal are exposed.

In this semiconductor device, the externally leading out terminal is projecting out from the surface of the epoxy resin body opposite to the back surface of the metallic base plate.

A thirteenth aspect of the invention is a semiconductor device having a case-less construction manufactured by the method according to any one of the first through ninth aspects and eleventh aspect of the invention, comprising: an insulated circuit board with a conducting pattern that have a conductive layer on a back surface of an insulating substrate of the circuit board and a conducting pattern layer on a front surface of the circuit board; a metallic base plate that is adhered through a solder to the conductive layer of the insulated circuit board; a semiconductor chip adhered to the conducting pattern layer; an externally leading out terminal that is adhered to the conducting pattern layer and disposed through the insulated circuit board with a conducting pattern and the metallic base plate; a bonding wire connecting the semiconductor chip and the conducting pattern layer; and an epoxy resin body from which a back surface of the metallic base plate and an end portion of the externally leading out terminal are exposed.

In this semiconductor device the externally leading out terminal is projecting out from the back surface of the metallic base plate.

Embodiments of the present invention provide a method of manufacturing a semiconductor device, the method being capable of manufacturing a semiconductor device of high reliability, case-less construction in diversified, small-lot production using a simple molding jig. Embodiments of the present invention also provide a semiconductor device that is manufactured by the method of manufacturing a semiconductor device.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

Some embodiments of the present invention will be described in detail in the following with reference to the accompanying drawings.

First Embodiment

Figure 1:
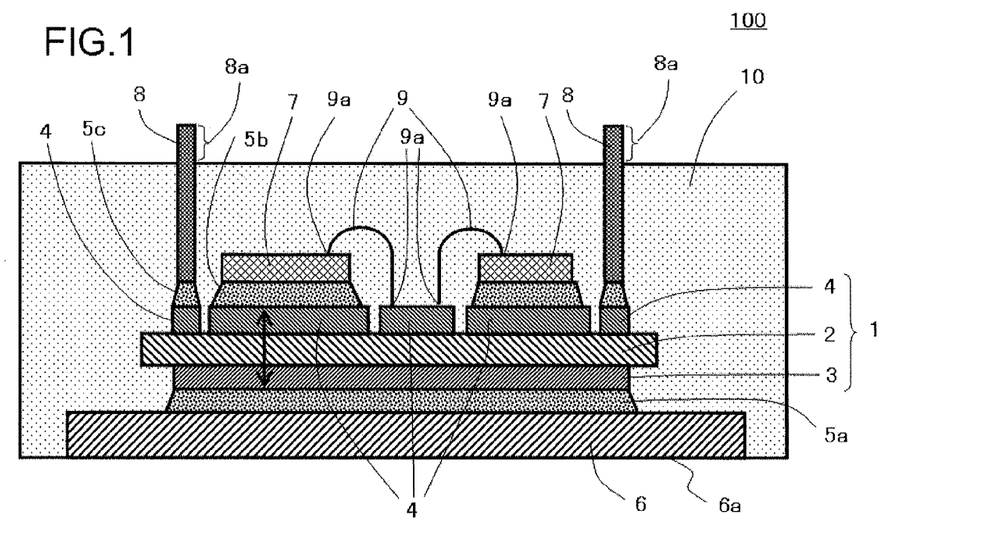
FIG. 1 is a sectional view of a part of a semiconductor device 100 according to a first embodiment of the invention.

FIG. 1 is a sectional view of a part of a semiconductor device 100 according to a first embodiment of the invention. This semiconductor device 100 is a semiconductor device with a case-less construction manufactured by a manufacturing method according to the second embodiment and an example of a semiconductor module. The case-less construction is referred to a construction that does not have a resin, for example PPS resin, of outer frame corresponding to the terminal case 61 described earlier.

This semiconductor device 100 comprises an insulated circuit board 1 with a conducting pattern, the insulated circuit board being composed of an insulating substrate 2 made of ceramic, a conductive layer 3 formed on the back surface of the insulating substrate 2, and a conducting pattern layer 4 formed on the front surface of the insulating substrate 2. The semiconductor device 100 also comprises a metallic base plate 6 adhered to the conductive layer 3 through the solder joint 5a. The semiconductor device 100 further comprises a semiconductor chip 7 fixed to the conducting pattern layer 4 through the solder joint 5b, an externally leading out terminal 8 fixed to the conducting pattern layer 4, and bonding wires 9 connecting the semiconductor chip 7 and the conducting pattern layer 4. The semiconductor device 100 comprises an epoxy resin body 10 from which the back surface 6a of the metallic base plate 6 and the end portion 8a of the externally leading out terminal 8 are exposed. Though not depicted in the figures, attaching holes are formed on the periphery of the epoxy resin body 10.

The semiconductor device 10 lacks the terminal case 61 formed of PPS resin shown in FIG. 10, and the epoxy resin body 10 works simultaneously as the terminal case 61 and the surface protecting material of silicone gel 60 in FIG. 10.

The epoxy resin body 10 firmly fixes the solder joint 5a between the metallic base plate 6 and the conductive layer 3, the solder joint 5b between the semiconductor chip 7 and the conducting pattern layer 4, and the joint 9a of the bonding wire 9, and relaxes the stress caused by the difference in the thermal expansion between the components. Therefore, the power cycle performance of the semiconductor device 100 is improved, and an elongated life, or high reliability, of the semiconductor device 100 is achieved.

Second Embodiment

FIG. 2A through FIG. 5 show a method of manufacturing a semiconductor 100 according to a second embodiment of the invention given in the sequence of manufacturing steps.

Figure 2A:
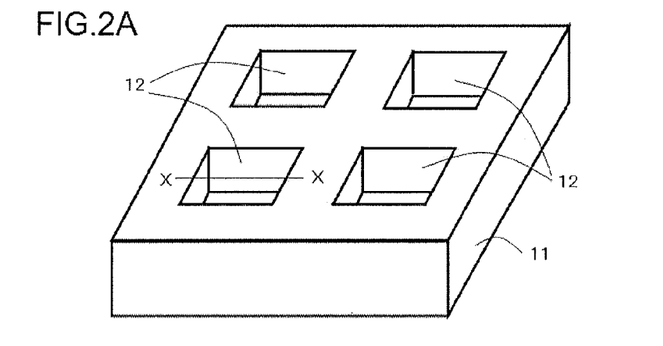
FIGS. 2A and 2B show processes or steps of manufacturing the semiconductor device 100 according to a second embodiment of the invention.

First referring to FIG. 2A, a supporting plate of an aluminum plate 11 having a plurality of recessed holes 12 is prepared. The aluminum plate 11 is one of the components of a simple molding jig 101 shown in FIG. 6. The configuration of the recessed hole 12 is, for example, a rectangular parallelepiped. This configuration becomes an external configuration of the semiconductor device 100. This external configuration is not limited to a rectangular parallelepiped, but can be changed to other configuration. FIG. 2A is a perspective view of the aluminum plate 11.

Figure 2B:
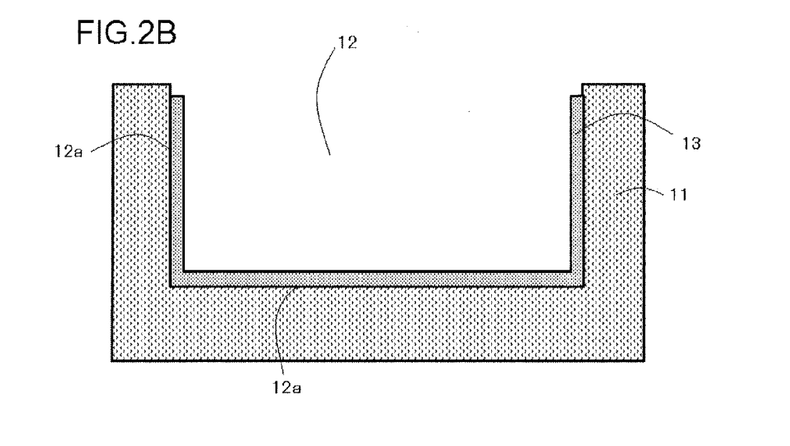

A releasing sheet 13 is disposed on the inner surface 12a of the recessed hole 12 as shown in FIG. 2B. The releasing sheet 13 has a thickness of about 0.05 mm and is necessary in order to smoothly release the epoxy resin body 10 from the recessed hole 12.

The releasing sheet 13 can be formed in advance in the form fitting to the recessed hole 12. Alternatively, the releasing sheet 13 is put on the hole 12 and pushed by a pressing body that fits to the hole 12 for the releasing sheet 13 to be adhered to the inner surface 12a of the hole 12. The releasing sheet 13 is used to smoothly release the epoxy resin body 10 from the recessed hole 12, and is one of the components of the simple molding jig 101. FIG. 2B is a sectional view of a part cut along the line X-X in FIG. 2A.

Figure 3A:
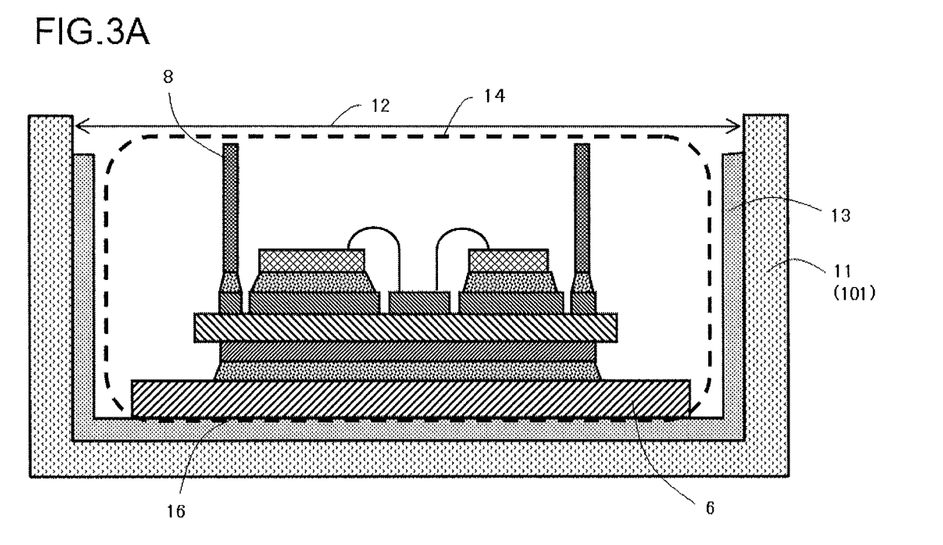
FIGS. 3A and 3B show processes or steps, following the processes or steps of FIGS. 2A and 2B, of manufacturing the semiconductor device 100 according to a second embodiment of the invention.

Referring to FIG. 3A, a skeleton structure 14 is disposed in the recessed hole 12 having the releasing sheet 13 disposed thereon. The skeleton structure 14 is a skeleton of the semiconductor device before it is contained in the epoxy resin body 10. FIG. 3A is a sectional view corresponding to FIG. 2B.

Figure 3B:
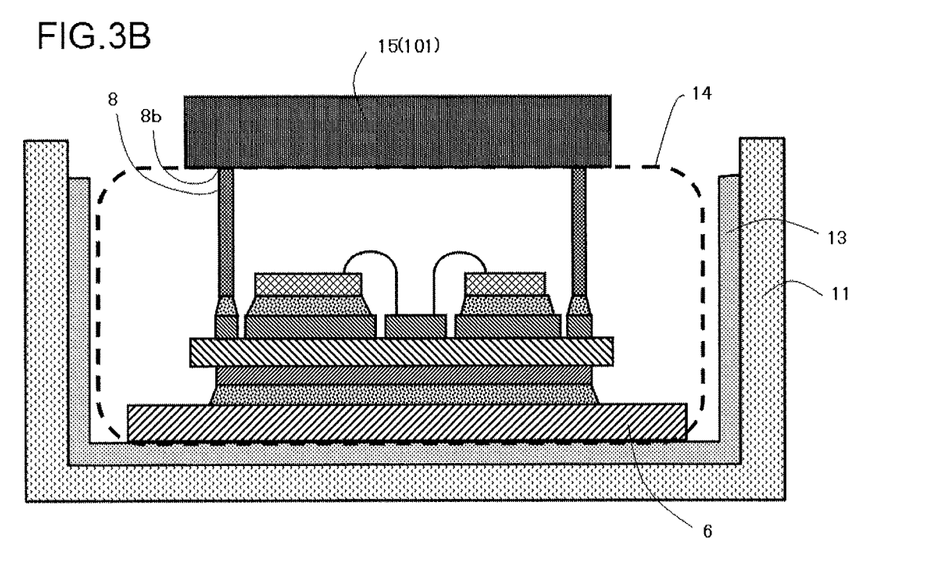

Referring to FIG. 3B, a metallic base plate 6, a part of the skeleton structure 14, is pushed against the releasing sheet 13 to adhere the two parts. Actual pressing method can include, for example, a self-weight of the skeleton structure 14, a dead weight 15 put on the tip 8b of the externally leading out terminal 8, and pressing on the externally leading out terminal 8 by a pressing mechanism. If this pressing force is less than 2 kPa, epoxy resin penetrates into the clearance between the metallic base plate 6 and the releasing sheet 13, requiring undesired process of cleaning the metallic base plate 6. Thus, the pressing force needs to be at least 2 kPa. The dead weight 15 and the pressing mechanism are components of a simple molding jig 101. FIG. 3B is a sectional view corresponding to FIG. 2B.

Figure 4A:
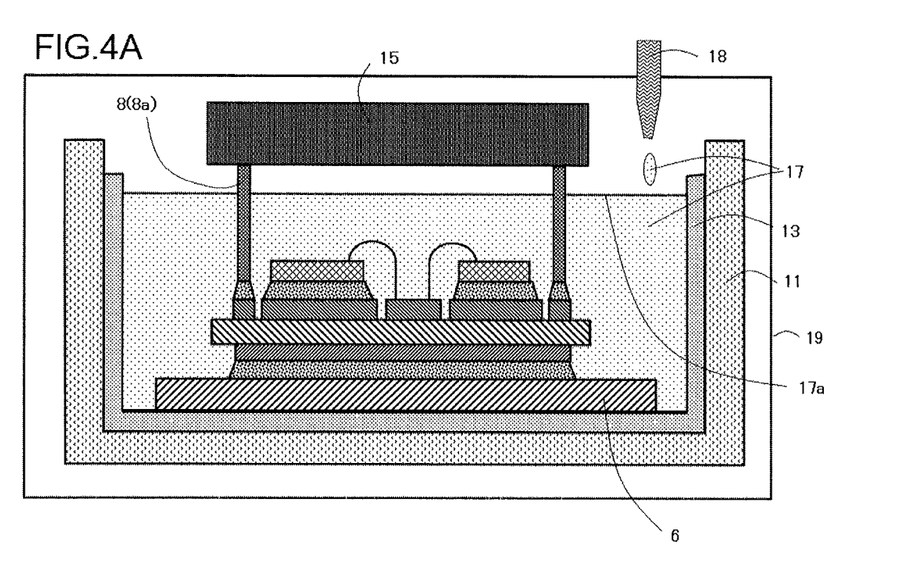
FIGS. 4A and 4B show processes or steps, following the processes or steps of FIGS. 3A and 3B, of manufacturing the semiconductor device 100 according to a second embodiment of the invention.

Referring to FIG. 4A, liquid epoxy resin 17 is heated a little to a temperature between 30° C. to 60° C. to lower viscosity and poured into the recessed hole 12 using a dispenser 18. It is favorable to heat the molding jig 101 to prevent the epoxy resin from increasing its viscosity. Lowered viscosity let the liquid epoxy resin 17 penetrate into the space around the skeleton structure 14 and prevents a void from being formed in the vicinity of the skeleton structure 14. Degassing during the process of pouring the liquid epoxy resin 17 significantly reduces the void formation. The liquid epoxy resin 17 is poured up to a position at which the liquid level 17a is lower than the end 8a of the externally leading out terminal 8 so that the end 8a is exposed from the liquid epoxy resin 17. Heating and hardening of the liquid epoxy resin 17 poured into the recessed hole 12 can be carried out using a thermostatic chamber 19 or a hot plate. Alternatively, the molding jig 101 can be provided with a heating mechanism. The dispenser 18 is one of the components of the simple molding jig 101. FIG. 4A is a sectional view corresponding to FIG. 2B.

Figure 4B:
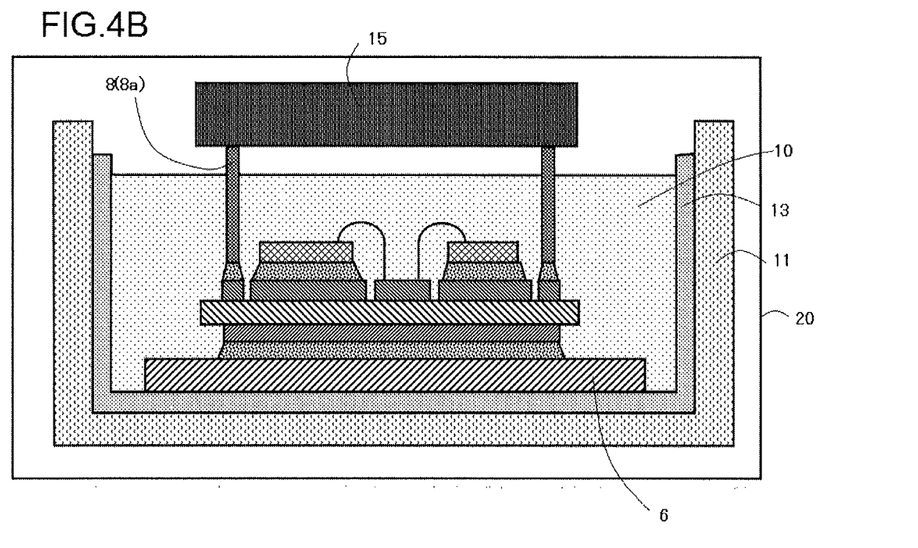

Referring to FIG. 4B, the aluminum plate 11 is heated to harden the liquid epoxy resin 17, forming the epoxy resin body 10 containing the skeleton structure 14. The heating process can be carried out using a reflow furnace 20, for example. FIG. 4B is a sectional view corresponding to FIG. 2B.

Figure 5:
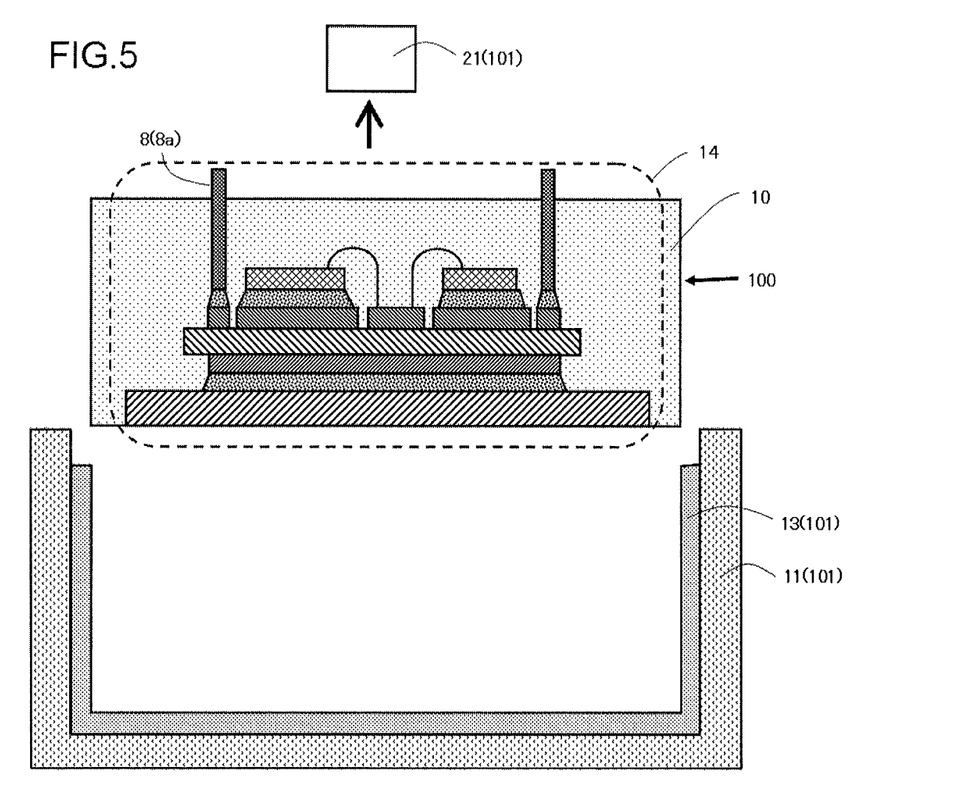
FIG. 5 shows a process or step following the processes or steps of FIGS. 4A and 4B, of manufacturing the semiconductor device 100 according to a second embodiment of the invention.

Referring to FIG. 5, after the liquid epoxy resin 17 has been hardened, the aluminum plate 11 is returned to the room temperature and the epoxy resin body 10 containing the skeleton structure 14 is lifted up from the recessed hole 12 of the aluminum plate 11 using a lifting mechanism 21. Because the releasing sheet 13 is disposed on the recessed hole 12, the epoxy resin body 10 can be easily lifted up. The lifting mechanism 21 is one of the components of the simple molding jig 101. The epoxy resin body 10 can also be released by turning the aluminum plate 11 upside down. In this case, the lifting mechanism 21 is unnecessary. Thus, a semiconductor device 100 with a case-less construction is completed in the form of the epoxy resin body 10. FIG. 5 is a sectional view corresponding to FIG. 2B.

If the epoxy resin body 10 is lifted up together with the releasing sheet 13 from the recessed hole 12, the releasing sheet 13 is removed from the epoxy resin body 10 to obtain a completed semiconductor device 100 having a case-less construction.

Figure 6:
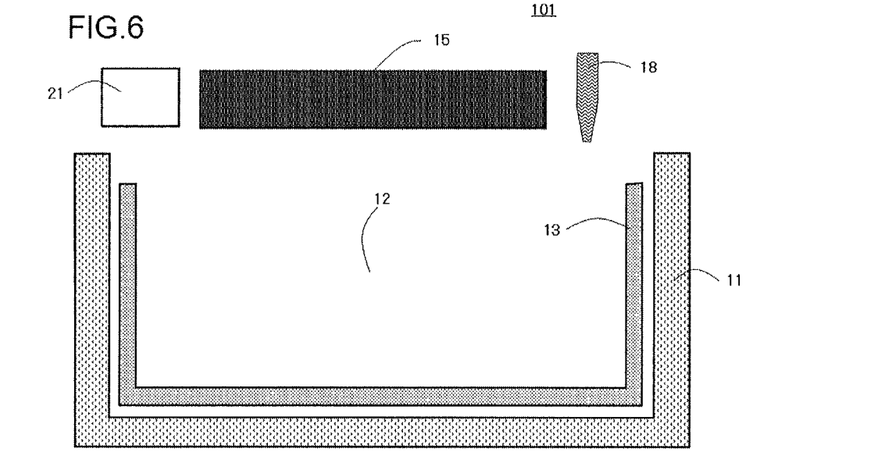
FIG. 6 shows the components of a simple molding jig 101.

FIG. 6 shows components of a simple molding jig 101. The simple molding jig 101 includes: support plate of aluminum plate 11 having a recessed hole 12; a releasing sheet 13; a pressing means, which can be a dead weight 15, a self-weight, or a pressing mechanism onto the externally leading out terminal; a lifting up mechanism 21; and dispenser 18. The equipment cost of this simple molding jig 101 is remarkably lower than that of a transfer molding apparatus and that of a compression molding apparatus.

Figure 7A:
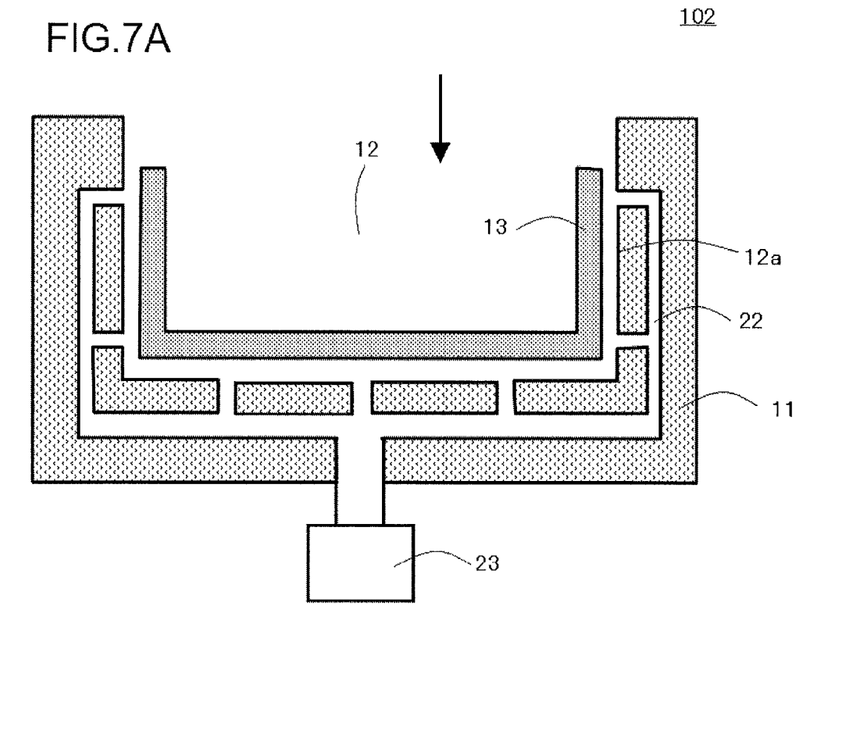
FIGS. 7A and 7B are a sectional view and a planar view seen from the direction of the arrow in FIG. 7A showing the components of another simple molding jig 102.
Figure 7B:
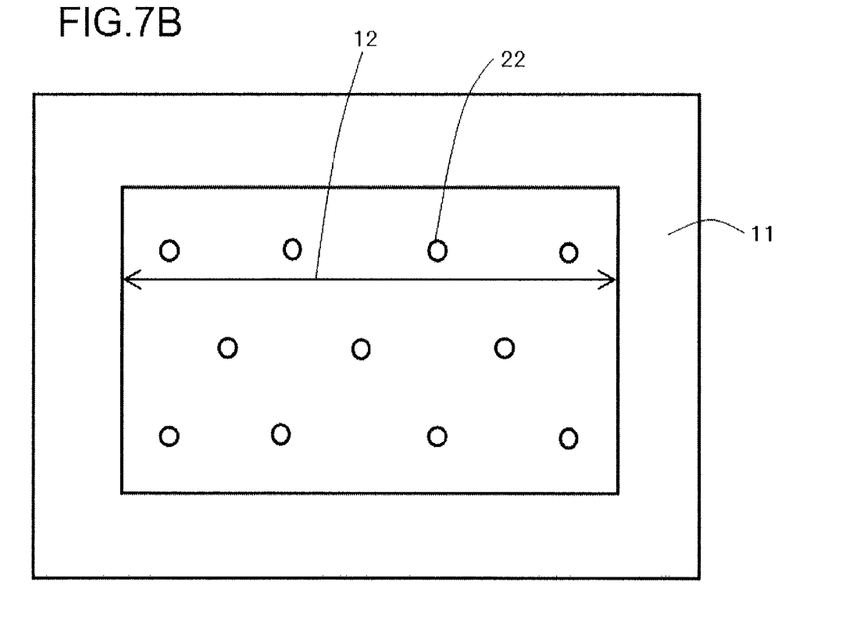

FIGS. 7A and 7B show a construction of another simple molding jig 102, in which FIG. 7A is a sectional view of a part of the jig and FIG. 7B is a plan view of the part seen from the direction of the arrow in FIG. 7A. This molding jig 102 is different from the molding jig of FIG. 6 in that a number of small passages 22 are formed opening to the recessed hole 12, and the releasing sheet 13 is drawn through the passages 22 and adhered to the inner surface 12a of the recessed hole 12 by a vacuum pump 23. The vacuum pump 23 is one of the components of the simple molding jig 102. This simple molding jig 102 allows the releasing sheet 13 to be drawn and adhered firmly onto the recessed hole 12 in the step of FIG. 2B. Upon stopping evacuation, the releasing sheet 13 becomes readily removable from the recessed hole 12.

Viscosity of the liquid epoxy resin 17 is preferably at most 50 Pa·s at a time of pouring. The releasing sheet 13 is preferably a fluorine-containing resin film having a thickness of about 0.05 mm.

Specific examples of materials for the releasing sheet 13 includes polytetrafluoroethylene (PTFE), polytetrafluoroethylene/perfluoroalcoxyethylene copolymer (PFA), and tetrafluoroethylene/ethylene copolymer (ETFE).

The above-described manufacturing methods according to embodiments of the invention do not use a transfer molding apparatus or a compression molding apparatus, but use inexpensive, simple molding jig 101 or 102 to mold the epoxy resin body 10. The epoxy resin body 10 covering the skeleton structure 14 improves reliability of the solder joint 5a and the joint 9a of the bonding wire.

Adhering strength between the releasing sheet 13 and the epoxy resin body 10 is preferably at most 10 kPa so that the epoxy resin body 10 can be smoothly released from the recessed hole 12. An adhering strength higher than 10 kPa would make the epoxy resin body 10 hardly released from the releasing sheet 13.

The releasing sheet 13 can be easily renewed when damaged or soiled.

The releasing sheet can be made of a material other than those described previously as far as the adhering strength between the releasing sheet 13 and the epoxy resin body 10 can be made within 10 kPa.

The support plate of aluminum plate 11 has an enough strength not to deform in the hardening process of the liquid epoxy resin 17. As long as it does not deform in the hardening process of the liquid epoxy resin 7, the support plate is not necessarily made of aluminum.

Though not depicted, a recessed hole 12 having tapered side walls, which means the top of the hole is wider than the bottom, allows the epoxy resin body 10 to be released from the recessed hole more easily.

The viscosity of the liquid epoxy resin 17 is preferably not higher than 50 Pa-s (=50,000 cP) at a time of pouring as mentioned earlier. Liquid epoxy resin 17 at a viscosity higher than 50 pa-s hardly penetrate into a gap around the skeleton structure, generating a void. Thus, the viscosity at a time of pouring is preferably at most 50 Pa-s, more preferably at most 5 Pa-s, and most preferably at most 0.1 Pa-s.

In the procedure from pouring to hardening of the liquid epoxy resin 17, it is preferably to push the metallic base plate 6 of the skeleton structure 14 against the releasing sheet 13 at a pressure of at least 2 kPa. The compression restrains generation of clearance 16 between the two parts, and prevents liquid epoxy resin 17 from adhering onto the back surface 6a of the metallic base plate 6. Epoxy resin adhered and hardened if any is preferably removed by grinding.

For diversified, small-lot production of the semiconductor devices, the configuration of the recessed hole 12 can easily be changed. Thus, a method of manufacturing a semiconductor device 100 with a case-less construction of embodiments of the present invention is suited to diversified, small-lot production.

Table 1 shows experimental results for some test items under various molding conditions on the fabricated semiconductor devices. The test items include: adhering strength between the releasing sheet 13 and the epoxy resin body 10, warping of the metallic base plate 6 after molding with the resin, external appearance of the semiconductor device, and power cycle performance. The molding conditions include: presence of a terminal case, material of the support plate, and material of the releasing sheet.

through 3 were conducted using releasing sheets 13 of PTFE in Experiment 1, PFA in Experiment 2, and ETFE in Experiment 3.

Experiment 4 was conducted by a conventional method using a terminal case made of polyphenylene sulfide (PPS). Experiment 5 used a PTFE plate in place of an aluminum plate 11 and did not use a releasing sheet 13.

Experiment 6 was conducted without a releasing sheet 13. Experiment 7 used a releasing sheet 13 made of polyethylene (PE), and Experiment 8 used a releasing sheet 13 made of polycarbonate (PC).

Though not shown in Table 1, an experiment was conducted under the same condition as Experiment 3 except that the pressure for pressing the metallic base plate 6 was changed to 1 kPa. This experiment generated a clearance 16 and caused the liquid epoxy resin 17 to adhere to the back surface of the metallic base plate 6 resulting in poor external appearance.

The results of experiments shown in Table 1 are summarized as follows.

(1) The conditions of Experiments 1 through 3 resulted in the adhering strength not higher than 10 kPa, small warping, good external appearance, and no problem in power cycle test up to a target value of 2,000 cycles, and can be employed for a method of embodiments of the present invention.

(2) The conditions of Experiments 4 and 5 resulted in power cycle tests below the target value of 2,000 cycles, and cannot be employed for a method of embodiments of the invention, (3) The conditions of Experiments 6 through 8 resulted in impossible releasing and poor external appearance, and thus, cannot be employed for a method of embodiments of the invention.

The power cycle tests were conducted after grinding off the epoxy resin adhered on the metallic base plate 6. The value of 1,000 cycles in Experiment 4 can be estimated to

TABLE 1

|  | Exp. 1 | Exp. 2 | Exp. 3 | Exp. 4 | Exp. 5 | Exp. 6 | Exp. 7 | Exp. 8 |
| --- | --- | --- | --- | --- | --- | --- | --- | --- |
| terminal case | none | none | none | present | none | none | none | none |
| support plate | Al | Al | Al | — | PTFE | Al | Al | Al |
| releasing sheet | PTFE | PFA | ETFE | — | none | none | PE | PC |
| compression (kPa) | 2 | 2 | 2 | — | 2 | 2 | 2 | 2 |
| epoxy resin | *1 | *1 | *1 | *1 | *1 | *1 | *1 | *1 |
| adhering strength (kPa) | 4 | 7 | 10 | — | 4 | 350 | *2 | *2 |
| warping (μm) | −10 | −15 | −12 | −67 | −225 | *3 | *3 | *3 |
| external appearance | good | good | good | good | good | poor | poor | poor |
| power cycle (cycles) | >2,000 | >2,000 | >2,000 | 1,000 | 300 | — | — | — |

*1 liquid epoxy resin with a viscosity of 5 Pa-s before hardening
*2 measurement impossible
*3 releasing impossible
'Al' in 'support' row is an aluminum plate having a recessed hole.
'PTFE' in 'support' row is a PTFE plate having a recessed hole.

The hardening process for the liquid epoxy resin 17 was carried out through three steps of a first hardening step at 100° C. for 1 hr, a second hardening step at 140° C. for 1 hr, and a third hardening step at 180° C. for 1 hr in this order. The experiments were conducted under eight different conditions; Experiment 1 through Experiment 8.

Experiments 1 through 3, and 6 through 8 were conducted using a support plate of aluminum plate 11. Experiments 1 correspond to more than 150,000 cycles under practical operation conditions.

The experiments have shown the following.

Fluorine-containing resin such as PTFE, PFA, and ETFE is a favorable material for the releasing sheet 13. A support plate of aluminum late 11 is favorable, but PTFE cannot be used because of large warping. Provision of a terminal case causes large warping.

Third Embodiment

Figure 8:
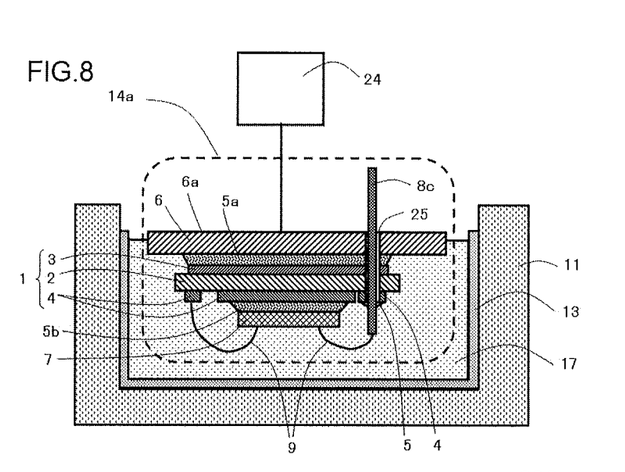
FIG. 8 shows a process or step in the method of manufacturing a semiconductor device 200 according to a third embodiment of the invention.

FIG. 8 shows a third embodiment of a method of manufacturing a semiconductor device, which is the semiconductor device 200 in this embodiment, of embodiments of the present invention. This method of FIG. 8 differs from the method of manufacturing the semiconductor device 100 according to the second embodiment in that the skeleton structure 14 is turned upside down and immersed into liquid epoxy resin 17. This method prevents the back surface 6a of the metallic base plate 6 from being attached with liquid epoxy resin 17. The externally leading out terminal 8c in this case is covered with an insulating film 25 at the places through the metallic base plate 6, the insulated circuit board 1 with conducting pattern, and the solder 5.

The skeleton structure 14a turned upside down can be positioned by hanging down the metallic base plate 6 and the skeleton structure 14a using a hanging mechanism 24.

Fourth Embodiment

Figure 9:
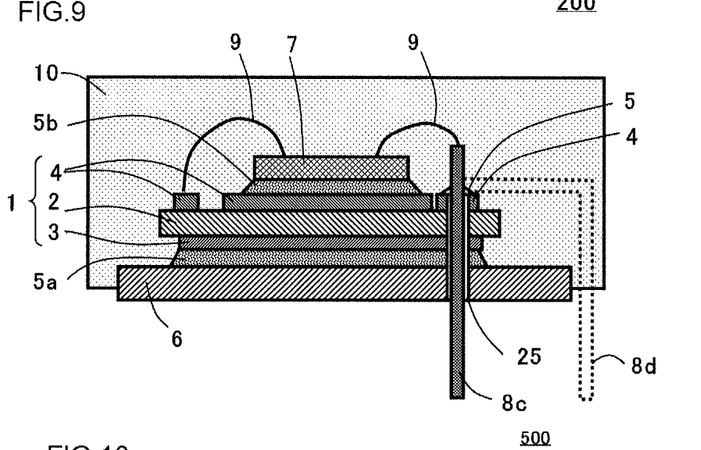
FIG. 9 is a sectional view of a part of the semiconductor device 200 according to a fourth embodiment.

FIG. 9 is a sectional view of a part of the semiconductor device 200 according to a fourth embodiment. The semiconductor device 200 is a semiconductor device, which is a semiconductor module, having a case-less construction manufactured by the method according to the third embodiment shown in FIG. 8. The externally leading out terminal 8c is insulated with an insulating film 25 and lead out through the conductive layer 3 and the metal base plate 6. The externally leading out terminal 8c can be extracted in the horizontal direction. In some cases, the terminal can be extracted not through the metallic base plate 6 as the externally leading out terminal 8d depicted by dotted lines in FIG. 9.

REFERENCE NUMERALS AND ELEMENTS LIST 1, 51: insulated circuit board with a conducting pattern
2: insulating substrate
3: conductive layer
4: conducting pattern layer
5a, 5b, 5c, 55a, 55b: solder joint
6, 56: metallic base plate
7, 57: semiconductor chip
8, 8c, 8d, 58: externally leading out terminal
8a: end of the externally leading out terminal
8b: tip
9, 59a, 59b: bonding wire
9a: joint of a bonding wire
10: epoxy resin body
11: aluminum plate
12: recessed hole
12a: inner surface
13: releasing sheet
14, 14a: skeleton structure
15: dead weight
16: clearance
17: liquid epoxy resin
18: dispenser
19: thermostatic chamber
20: reflow furnace
21: lifting mechanism
22: passage
23: vacuum pump
24: hanging mechanism
25: insulating film
52: ceramic
53, 54: metal foil
60: silicone gel
61: terminal case
62: lid
100, 200: semiconductor device
101, 102: molding jig
500: semiconductor module Although a few embodiments have been shown and described, it would be appreciated by those skilled in the art that changes may be made in these embodiments without departing from the principles and spirit of the invention, the scope of which is defined in the claims and their equivalents.

What is claimed is:

1. A method of manufacturing a semiconductor device, comprising:
    disposing a releasing sheet into a recessed hole formed in a support plate;
    disposing a skeleton structure of the semiconductor device, before covering the skeleton structure with epoxy resin, into the recessed hole, the skeleton structure having a leading out terminal, the skeleton structure of the semiconductor device being turned upside down and disposed in the recessed hole with an arrangement not to be in contact with an inner wall of the recessed hole;
    pouring liquid epoxy resin into the recessed hole, the liquid epoxy resin filling the recessed hole up to a level such that an end portion of the leading out terminal is extending out of an upper surface of the liquid epoxy resin, wherein a back surface of a metallic base plate composing the skeleton structure of the semiconductor device is exposed from the upper surface of the poured liquid epoxy resin;
    hardening the liquid epoxy resin to obtain an epoxy resin body containing the skeleton structure; and
    taking out the hardened epoxy resin body from the recessed hole.

2. The method of manufacturing a semiconductor device according to claim 1, wherein the configuration of the recessed hole is a rectangular parallelepiped.

3. The method of manufacturing a semiconductor device according to claim 1, wherein the configuration of the releasing sheet is such a configuration that fits to the recessed hole.

4. The method of manufacturing a semiconductor device according to claim 1, wherein the releasing sheet is fitted in close contact to inner sidewalls of the recessed hole.

5. The method of manufacturing a semiconductor device according to claim 1, wherein the releasing sheet is fitted in close contact to an inner wall of the recessed hole by evacuation.

6. The method of manufacturing a semiconductor device according to claim 1, wherein viscosity of the liquid epoxy resin is at most about 50 Pa-s at a time of pouring.

7. The method of manufacturing a semiconductor device according to claim 1, wherein the releasing sheet is made of a fluorine-containing resin.

8. The method of manufacturing a semiconductor device according to claim 7, wherein the fluorine-containing resin is selected from the group consisting of polytetrafluoroethylene, polytetrafluoroethylene/perfluoroalkoxyethylene copolymer, and tetrafluoroethylene/ethylene copolymer.

9. The method of manufacturing a semiconductor device according to claim 1, wherein adhesion strength between the releasing sheet and the hardened epoxy resin body is at most about 10 kPa.

10. The method according to claim 1, wherein the semiconductor device manufactured by the method has a caseless construction and comprises:
- an insulated circuit board with a conducting pattern, the circuit board having a conductive layer on a back surface of an insulating substrate of the circuit board and a conducting pattern layer on a front surface of the insulating substrate of the circuit board;
- the metallic base plate, adhered through a solder to the conductive layer of the insulated circuit board;
- a semiconductor chip adhered to the conducting pattern layer;
- the externally leading out terminal, adhered to the conducting pattern layer and disposed through the insulated circuit board with a conducting pattern and the metallic base plate;
- a bonding wire connecting the semiconductor chip and the conducting pattern layer; and
- the epoxy resin body from which a back surface of the metallic base plate and an end portion of the externally leading out terminal are exposed.

11. The method according to claim 7, wherein the semiconductor device manufactured by the method comprises:
- an insulated circuit board with a conducting pattern, the circuit board having a conductive layer on a back surface of an insulating substrate of the circuit board and a conducting pattern layer on a front surface of the insulating substrate of the circuit board;
- the metallic base plate, adhered through a solder to the conductive layer of the insulated circuit board;
- a semiconductor chip adhered to the conducting pattern layer;
- the externally leading out terminal, adhered to the conducting pattern layer;
- a bonding wire connecting the semiconductor chip and the conducting pattern layer; and
- the epoxy resin body from which a back surface of the metallic base plate and an end portion of the externally leading out terminal are exposed.

12. The method according to claim 1, wherein the semiconductor device manufactured by the method comprises:
- an insulated circuit board with a conducting pattern, the circuit board having a conductive layer on a back surface of an insulating substrate of the circuit board and a conducting pattern layer on a front surface of the insulating substrate of the circuit board;
- the metallic base plate, adhered through a solder to the conductive layer of the insulated circuit board;
- a semiconductor chip adhered to the conducting pattern layer;
- the externally leading out terminal, adhered to the conducting pattern layer;
- a bonding wire connecting the semiconductor chip and the conducting pattern layer; and
- the epoxy resin body from which a back surface of the metallic base plate and an end portion of the externally leading out terminal are exposed.

13. The method according to claim 2, wherein the semiconductor device manufactured by the method comprises:
- an insulated circuit board with a conducting pattern, the circuit board having a conductive layer on a back surface of an insulating substrate of the circuit board and a conducting pattern layer on a front surface of the insulating substrate of the circuit board;
- the metallic base plate, adhered through a solder to the conductive layer of the insulated circuit board;
- a semiconductor chip adhered to the conducting pattern layer;
- the externally leading out terminal, adhered to the conducting pattern layer;
- a bonding wire connecting the semiconductor chip and the conducting pattern layer; and
- the epoxy resin body from which a back surface of the metallic base plate and an end portion of the externally leading out terminal are exposed.

14. The method according to claim 3, wherein the semiconductor device manufactured by the method comprises:
- an insulated circuit board with a conducting pattern, the circuit board having a conductive layer on a back surface of an insulating substrate of the circuit board and a conducting pattern layer on a front surface of the insulating substrate of the circuit board;
- the metallic base plate, adhered through a solder to the conductive layer of the insulated circuit board;
- a semiconductor chip adhered to the conducting pattern layer;
- the externally leading out terminal, adhered to the conducting pattern layer;
- a bonding wire connecting the semiconductor chip and the conducting pattern layer; and
- the epoxy resin body from which a back surface of the metallic base plate and an end portion of the externally leading out terminal are exposed.

15. The method according to claim 4, wherein the semiconductor device manufactured by the method comprises:
- an insulated circuit board with a conducting pattern, the circuit board having a conductive layer on a back surface of an insulating substrate of the circuit board and a conducting pattern layer on a front surface of the insulating substrate of the circuit board;
- the metallic base plate, adhered through a solder to the conductive layer of the insulated circuit board;
- a semiconductor chip adhered to the conducting pattern layer;
- the externally leading out terminal, adhered to the conducting pattern layer;
- a bonding wire connecting the semiconductor chip and the conducting pattern layer; and
- the epoxy resin body from which a back surface of the metallic base plate and an end portion of the externally leading out terminal are exposed.

16. The method according to claim 5, wherein the semiconductor device manufactured by the method comprises:
- an insulated circuit board with a conducting pattern, the circuit board having a conductive layer on a back surface of an insulating substrate of the circuit board and a conducting pattern layer on a front surface of the insulating substrate of the circuit board;
- a metallic base plate that is adhered through a solder to the conductive layer of the insulated circuit board;
- a semiconductor chip adhered to the conducting pattern layer;
- the externally leading out terminal, adhered to the conducting pattern layer;
- a bonding wire connecting the semiconductor chip and the conducting pattern layer; and
- the epoxy resin body from which a back surface of the metallic base plate and an end portion of the externally leading out terminal are exposed.

17. The method according to claim 6, wherein the semiconductor device manufactured by the method comprises:
- an insulated circuit board with a conducting pattern, the circuit board having a conductive layer on a back surface of an insulating substrate of the circuit board and a conducting pattern layer on a front surface of the insulating substrate of the circuit board;

the metallic base plate, adhered through a solder to the conductive layer of the insulated circuit board;

a semiconductor chip adhered to the conducting pattern layer;

the externally leading out terminal, adhered to the conducting pattern layer;

a bonding wire connecting the semiconductor chip and the conducting pattern layer; and the epoxy resin body from which a back surface of the metallic base plate and an end portion of the externally leading out terminal are exposed.

18. A method of manufacturing a semiconductor device, comprising:

disposing a releasing sheet into a recessed hole formed in a support plate, the recessed hole having a top opening and a bottom;

disposing a skeleton structure of the semiconductor device, before covering the skeleton structure with epoxy resin, to the bottom of the recessed hole, the skeleton structure having a leading out terminal;

pouring liquid epoxy resin down into the recessed hole through the top opening of the recessed hole, the liquid epoxy resin filling the recessed hole up to a level such that an end portion of the leading out terminal is extending out of an upper surface of the liquid epoxy resin;

hardening the liquid epoxy resin to obtain an epoxy resin body containing the skeleton structure; and taking out the hardened epoxy resin body from the recessed hole, wherein the semiconductor device manufactured by the method has a case-less construction and comprises:

an insulated circuit board with a conducting pattern, the circuit board having a conductive layer on a back surface of an insulating substrate of the circuit board and a conducting pattern layer on a front surface of the insulating substrate of the circuit board;

a metallic base plate that is adhered through a solder to the conductive layer of the insulated circuit board;

a semiconductor chip adhered to the conducting pattern layer;

the externally leading out terminal, adhered to the conducting pattern layer and disposed through the insulated circuit board with a conducting pattern and the metallic base plate;

a bonding wire connecting the semiconductor chip and the conducting pattern layer; and the epoxy resin body from which a back surface of the metallic base plate and an end portion of the externally leading out terminal are exposed.

* * * * *